United States Patent [19]
Vinchant et al.

[11] Patent Number: 5,687,272
[45] Date of Patent: Nov. 11, 1997

[54] SEGMENTED OPTICAL WAVEGUIDE SUITABLE IN PARTICULAR FOR BEING INCLUDED IN A SEMICONDUCTOR DEVICE

[75] Inventors: Jean-François Vinchant, Bruyeres le Chatel; Léon Goldstein, Chaville; Denis LeClerc, Igny; Jean-Louis Gentner, Gif sur Yvette, all of France

[73] Assignee: Alcatel N.V., Rijswijk, Netherlands

[21] Appl. No.: 602,380

[22] Filed: Feb. 16, 1996

[30] Foreign Application Priority Data

Feb. 22, 1995 [FR] France ................... 95 02045

[51] Int. Cl.$^6$ ............... G02B 6/10; H01S 3/19
[52] U.S. Cl. ............ 385/131; 385/132; 385/14; 385/43; 385/49; 385/50; 385/129; 372/50
[58] Field of Search ............ 385/4, 9, 14, 43, 385/49, 50, 31, 39, 129–132, 2; 372/45–50

[56] References Cited

U.S. PATENT DOCUMENTS

| | | | |
|---|---|---|---|
| 4,913,506 | 4/1990 | Suzuki et al. | 385/130 |
| 5,078,516 | 1/1992 | Kapon et al. | 385/129 |
| 5,153,935 | 10/1992 | Mueller | 385/50 |
| 5,259,049 | 11/1993 | Bona et al. | 385/50 |
| 5,515,464 | 5/1996 | Sheem | 385/49 |
| 5,521,994 | 5/1996 | Takeuchi et al. | 385/14 |

FOREIGN PATENT DOCUMENTS

0583679A1 2/1994 European Pat. Off. .

OTHER PUBLICATIONS

J. M. Cheong et al, "High Alignment Tolerance Coupling Scheme for Mutichannel Laser Diode/Singlemode Fibre Modules Using a Tapered Waveguide Array", *Electronics Letters*, vol. 30, No. 18, Sep. 1, 1994, pp. 1515–1516.

O. Mitomi et al, "Design of a single-mode tapered waveguide for low-loss chip-to-fiber coupling", *IEEE Journal of Quantum Electronics*, vol. 30, No. 8, Aug. 1994, New York, US pp. 1787–1793.

M. Suzuki et al, "Monolithic integration of InGaAsP/InP", *Journal of Lightwave Technology*, vol. 5, No. 9, Sep. 1987, New York, pp. 1277–1285.

*Primary Examiner*—Rodney B. Bovernick
*Assistant Examiner*—Hemang Sanghavi
*Attorney, Agent, or Firm*—Sughrue, Mion, Zinn, Macpeak and Seas

[57] ABSTRACT

An optical waveguide includes, in monolithic manner, a rear segment, a transition segment, and a front segment extending and succeeding one another along the length of the waveguide. A lateral confinement factor and a width the waveguide are respectively larger and smaller in the rear segment than in the front segment. According to the invention, the width increases in the transition segment until it reaches a value that is larger than that of the front segment. The invention is particularly applicable to integrating together a laser and an optical modulator for a telecommunications system.

8 Claims, 5 Drawing Sheets

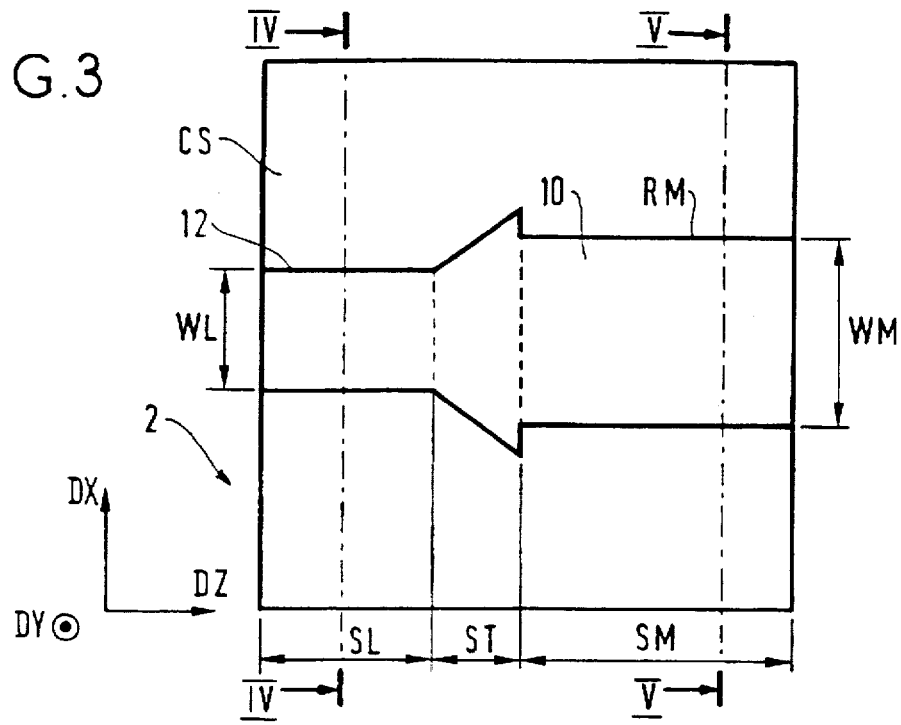
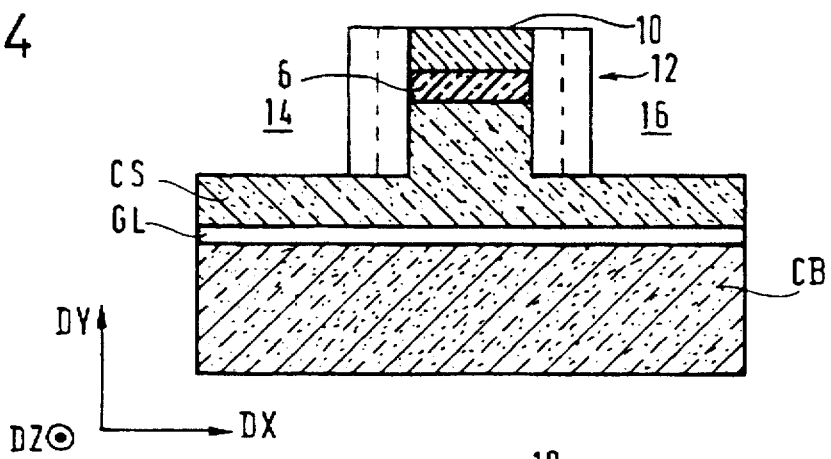
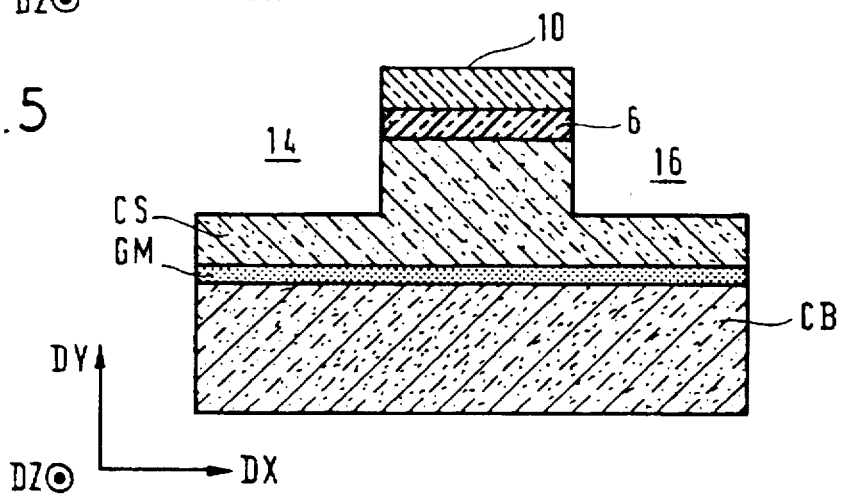

1

SEGMENTED OPTICAL WAVEGUIDE SUITABLE IN PARTICULAR FOR BEING INCLUDED IN A SEMICONDUCTOR DEVICE

The present invention generally relates to an optical waveguide having a plurality of segments.

BACKGROUND OF THE INVENTION

The invention relates more specifically to connecting together two waveguide structures having different confinement configurations. In particular, two such structures may be those of a buried ridge and of an external ridge formed in a common semiconductor chip constituting an optoelectronic component. Such a buried ridge and such an external ridge typically constitute the optical waveguides of a laser and of a modulator that are integrated together, the chip being based, for example, on indium phosphide. Such ridges are also known respectively by the terms "buried heterostructure" (or "BH"), and "ridge". Their respective characteristics are recalled in the following description.

The invention may however relate to other devices. Such devices may be implemented in glass or on electro-optical substrates such as lithium niobate. They may include various optical elements and connections between the elements which may be, for example, lasers, light-emitting diodes, input or output segments of the waveguide of an integrated circuit, optical fibers, switches, couplers, optical amplifiers, mirrors, filters, diffraction gratings, etc. Some of the elements or connections may be implemented by means of waveguide structures. Such a structure has a confinement configuration defined by the positions and the dimensions of its constituent elements in a cross-sectional plane, and by the refractive indices of said elements. For technological reasons or for reasons of performance, the configuration depends on the element or connection to be integrated. Thus, connections must sometimes be implemented between waveguide structures having different configurations, which structures then constitute successive segments of a common optical waveguide.

Generally, such connections give rise to loss of a portion of the guided light. In order to limit such loss, it is known for a transition segment to be interposed in series between the two waveguide segments constituted by the waveguide structures to be interconnected, the transition segment being constituted by a waveguide structure having a cross-sectional dimension that varies progressively from one end of the segment to the other end thereof.

Typically, with waveguide structures implemented using a planar technique, at each of the two ends of the transition segment, the width of the core of the segment is equal to the width of the core of the waveguide structure connected to the end, and the width varies linearly between the two ends.

Furthermore, in order to make it possible to manufacture the device industrially and cheaply, the transition segment must preferably be implemented at the same time and by the same means as at least one of the waveguide structures to be interconnected.

OBJECT AND SUMMARY OF THE INVENTION

A particular object of the present invention is to make it possible for a connection to be implemented cheaply, which connection gives rise to low light losses as the light passes between two waveguide structures having different optical parameters.

BRIEF DESCRIPTION OF THE DRAWINGS

An embodiment of the present invention is described in more detail below by way of non-limiting example and with reference to the accompanying drawings. When the same element is shown on more than one figure, it is given the same reference.

In the drawings:

FIG. 3 is a plan view of the chip after the delimitation layer has been etched and after the chip has been subjected to a first attack;

FIGS. 4 and 5 are two section views of the chip on respective cross-sectional planes IV—IV and V—V of FIG. 3 after the first attack.

MORE DETAILED DESCRIPTION

With reference to FIGS. 1 to 10, a description is given of how a buried ridge and an external ridge of the device may be implemented, in being understood that the ridges constitute two different waveguide structures and that the two structures must be connected together so as to constitute a rear portion and a front segment of an optical waveguide of the invention.

Figure 9:
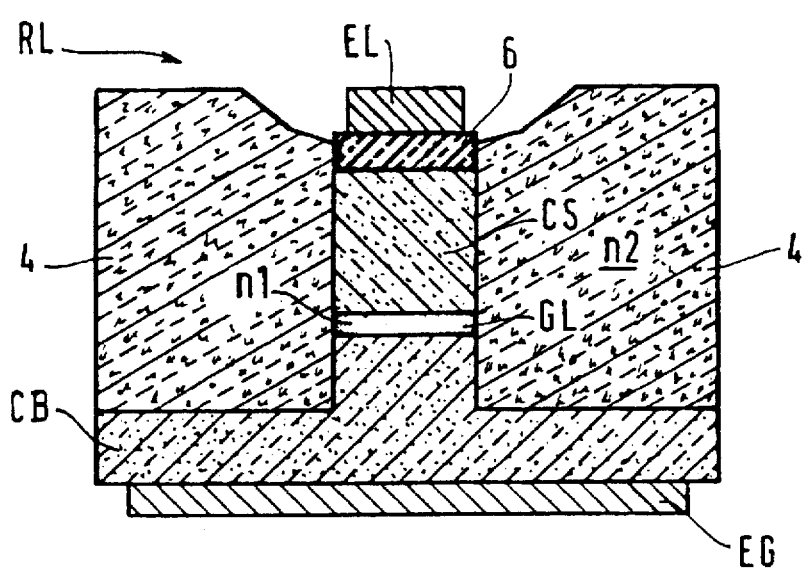
FIGS. 9 and 10 are two section views of the chip on the same cross-sectional planes, after electrodes have been formed, the chip then constituting a device of the invention.
Figure 10:
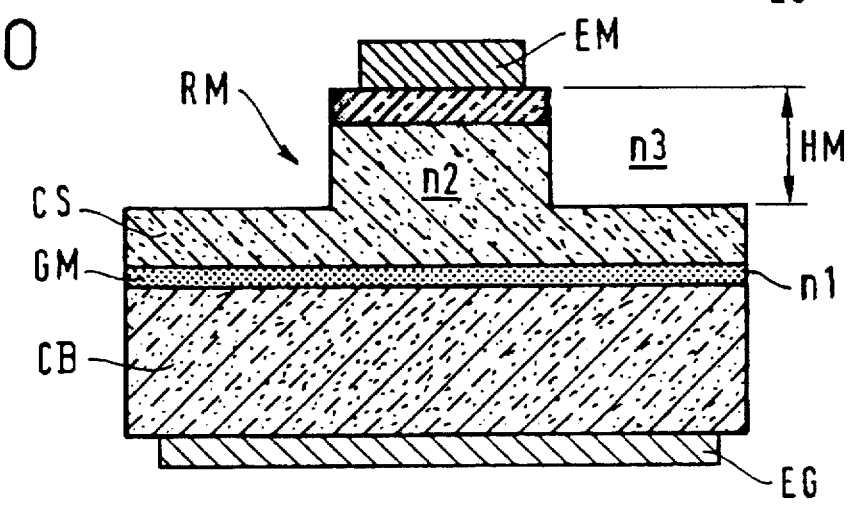

As shown in the figures, a device to be manufactured is formed in a substrate 2. For example, the substrate may be constituted by a semiconductor chip 2 formed of two layers extending in a horizontal longitudinal direction DZ and in a transverse direction DX, and mutually superposed in a vertical direction DY. These directions are defined relative to the chip. The chip includes a buried ridge segment SL extended by a transition segment ST, and an external ridge segment SM extending and succeeding each other in the longitudinal direction, and respectively including a buried ridge RL and an external ridge RM. The ridges are shown in FIGS. 9 and 10. The two segments are mutually aligned in the direction DZ.

Each of them includes a higher-index layer GL or GM situated between two confinement layers, one of which is a bottom confinement layer CB, the other being a top confinement layer CS. The higher index considered herein is a refractive index $n_1$ and it is higher than that of each of the confinement layers so as to limit the vertical extension of a single guided mode whereby a light wave should propagate longitudinally along the ridge.

The higher-index layer GL and the top confinement layer CS of the buried ridge RL are limited transversely between two lateral confinement blocks 4 that are portions of the chip 2. Each of the blocks has a refractive index $n_2$ that is lower than said higher index so that the transverse limitation of the higher-index layer limits the transverse extension of the mode guided by the ridge. Furthermore, the blocks are implemented so as to confine in the buried ridge a feed current flowing vertically through the chip. This may be achieved in known manner by increasing the electrical resistivity of a material constituting the blocks, and/or by forming a blocking semiconductor junction in the blocks.

The top confinement layer CS of the external ridge RM has a refractive index $n_2$ that is higher than the refractive index $n_3$ of a space, e.g. a gaseous space outside the chip. The top confinement layer is limited transversely between two recesses 14 and 16 in the chip belonging to the outside space and allowing the higher-index layer GM and the bottom confinement layer CB to remain. This transverse limitation of the top confinement layer limits the transverse extension of the mode guided by the ridge.

All of the layers are formed by epitaxial deposition on a substrate (not shown). For example, the substrate and the bottom confinement layer may be of the n type. For example, the top confinement layer CH may be of the p type as may a highly-doped contact layer 6 which is deposited on the top confinement layer.

The device to be manufactured also includes electrodes EL, EM, and EG formed above and below the chip in each of the segments. More precisely, the electrodes EL and EM are respectively formed on the buried ridge RL and on the external ridge RM, and the bottom electrode EG is common to both segments.

Figure 1:
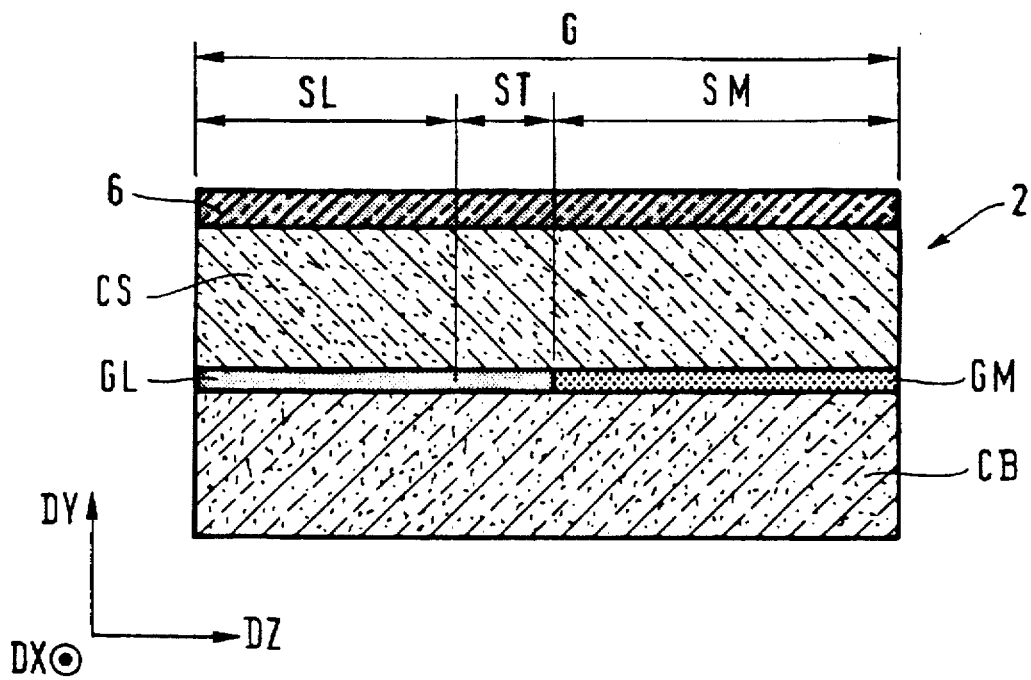
FIG. 1 is a longitudinal section view through a semiconductor chip in which the invention is to be implemented.
Figure 2:
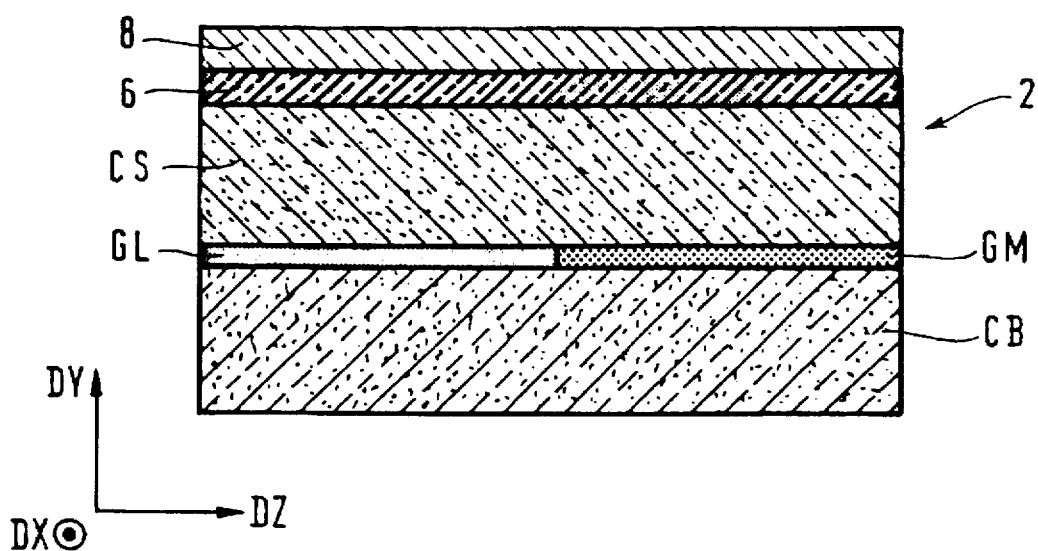
FIG. 2 is a longitudinal section view through the chip after a delimitation layer has been deposited.

The external ridge RM is formed by performing the following operations:

depositing the bottom confinement layer CB, forming the higher-index layer GL, GM by deposition, by etching and by deposition, depositing the top confinement layer CS, depositing a highly doped contact layer 6, and depositing a dielectric delimitation layer 8 shown in FIG. 2 and overlying the top confinement layer in both segments;

etching the delimitation layer so as to form a delimitation strip 10 in the external ridge segment SM, which strip coincides transversely with the external ridge RM to be formed; and attacking the chip with an attack medium sparing the delimitation strip 10. This attack is limited in depth so that it stops short of the higher-index layer GL, GM. The attack causes two initial side recesses 14 and 16 to appear as shown in FIG. 5, the recesses being situated on either side of the external ridge RM. This attack is referred to below as a first attack.

In order to align the ridges RL and RM automatically, the delimitation layer is etched so as also to form the delimitation strip 10 in the buried ridge segment SL by causing the strip to coincide transversely with the buried ridge RL to be formed. As a result, the first attack then uncovers in the first segment a buried ridge primer 12. This primer is shown in FIG. 4. It projects between the two initial side recesses 14 and 16 that are limited in depth so that they stop short of the higher-index layer GL.

Figure 6:
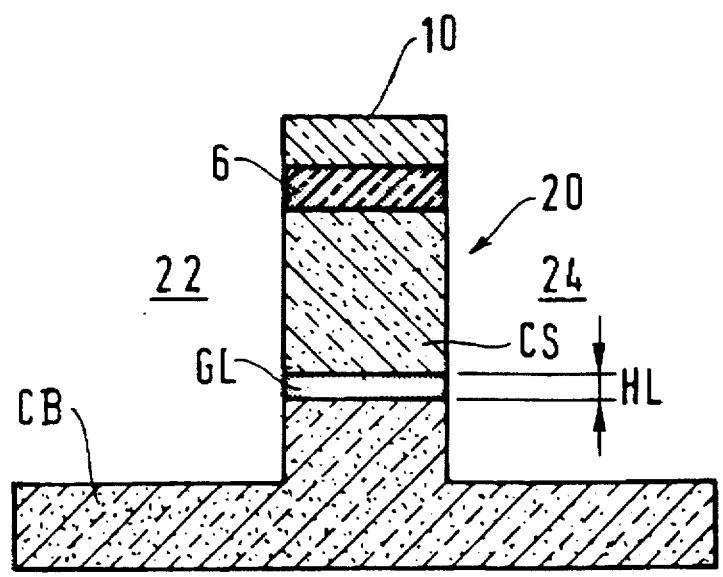
FIGS. 6 and 7 are two section views of the chip on the same cross-sectional planes after a second attack.
Figure 7:
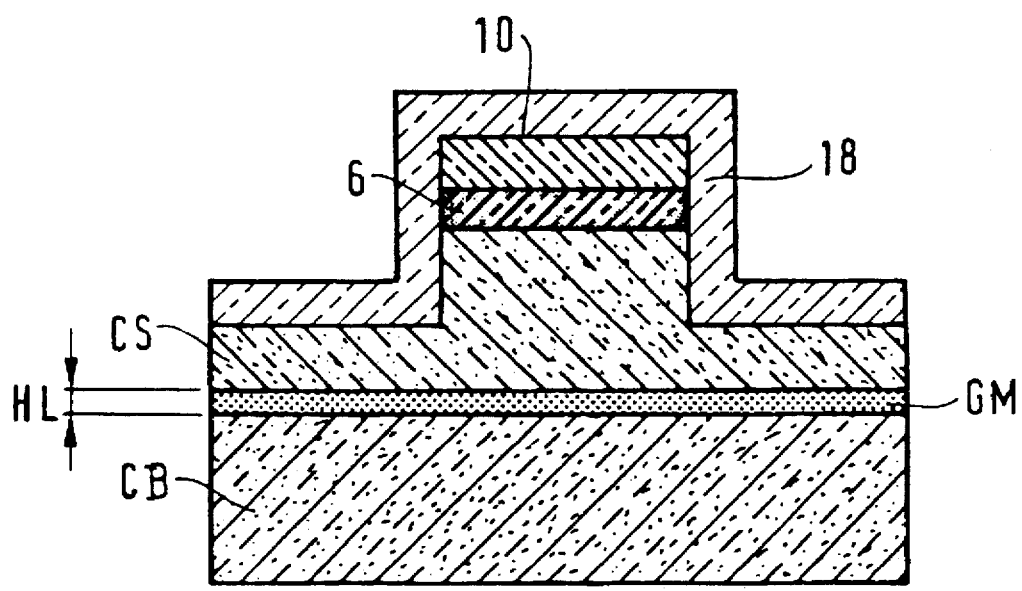
Figure 8:
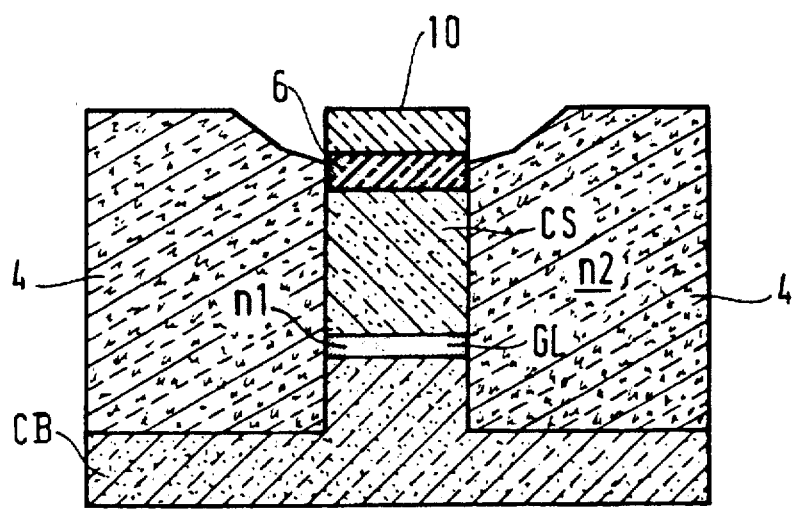
FIG. 8 is a section view of the chip on the cross-sectional plane IV—IV after side recesses have been filled.

The buried ridge is then formed by the following operations:

depositing a protective layer 18 in both segments SL and SM;

etching the protective layer 18 so that it remains in the external ridge segment RM only; and attacking the chip with an attack medium sparing the protective layer; this second attack is continued in depth beyond the higher-index layer GL so as to uncover in the buried ridge segment SL a buried ridge body 20; the body is shown in FIG. 6; it projects between two deepened side recesses 22 and 24; and selectively depositing at least one material 4 by using a selective deposition method which is ineffective on the remaining portions of the delimitation layer 10 and of the protective layer 18; this deposition constitutes the lateral confinement blocks 4 by filling said deepened side recesses.

Naturally, depending on the type of buried ridge laser to be implemented, the lateral confinement blocks may be constituted by depositing a succession of mutually different materials.

The delimitation layer 10 and the protective layer 18 are typically constituted by dielectric materials. The remaining portions of the delimitation layer and of the protective layer are then removed at least in part after the lateral confinement material 4 has been deposited and before the top electrodes EL and EM are formed.

For example, the confinement layers CB and CS may be constituted by indium phosphide InP, the higher-index layer GL may be constituted by ternary or quaternary alloys such as GaInAs or GaInAsP, or by superposing quantum wells constituted by such alloys and separated by barriers of indium phosphide, the delimitation layer 10 may be constituted by silicon nitride $Si_3N_4$, and the protective layer 18 may be constituted by silica $SiO_2$, at least one lateral confinement material 4 being constituted, for example, by semi-insulating indium phosphide.

Typically, the higher-index layer GL, GM has two different characteristic wavelengths such as 1,560 nm and 1,510 nm respectively in the two segments SL and SM so that the buried ridge segment SL constitutes a laser for emitting infrared light, and so that the external ridge segment SM constitutes a modulator for modulating the light.

The present invention makes it possible to interconnect two waveguide segments such as the above-described buried ridge and external ridge with minimum loss.

However, the invention may be used in other applications. That is why it generally provides an optical waveguide, the waveguide including, in monolithic manner, a rear portion SL, ST and a front segment SM extending and succeeding each other along the length of the waveguide and being connected together in a connection zone, the waveguide having a width W and a lateral confinement factor V at each point along its length, said factor being constituted by the ratio of optical power confined in the width divided by total optical power, the optical powers being those of the same light guided by the waveguide, said factor being greater in the rear portion than in the front segment in the vicinity of the connection zone, wherein the width is also greater in the rear portion than in the front segment in the vicinity of the connection zone.

For a point along the length of the guide included in a cross-sectional plane P in which x and y coordinates are defined, the x values along the abscissa being defined in the transverse direction DX, the lateral confinement factor (V) is defined by the following equation:

$$V = \int_{x_1}^{x_2} \int_{-\infty}^{+\infty} |E|^2 \cdot dx \cdot dy / \int \int_P |E|^2 \cdot dx \cdot dy$$

where $x_1$ and $x_2$ are the values along the abscissa of the two ends of the width of the waveguide, so that $W = x_2 - x_1$, and E designates the optical electrical field of the guided light.

Within certain limits for the width W corresponding to monomode guiding, the lateral confinement factor increases with increasing width. It also increases with the thickness of the ridge and with an index difference constituted by the difference between the ridge index and the lateral confinement index.

When a homogeneous ridge has a rectangular cross-section surrounded by a homogeneous confinement material, performs monomode guiding, and has a thickness H that remains small enough relative to its width W, the lateral confinement factor is as follows:

$$V = 2\pi . H . \lambda^{-1} . (n_1^2 - n_2^2)^{1/2} . W$$

where $n_1$ and $n_2$ are the refractive indices of the ridge and of the confinement material, and $\lambda$ is the wavelength of the guided light.

In a typical case where $n_1$ and $n_2$ remain very close to a constant mean value $n_m$, and where the index difference is defined by the equation $\Delta n = n_1 - n_2$, the confinement factor is $V = k.H.W.\Delta n^{1/2}$, where k is a coefficient that is independent of the cross-sectional dimensions, and that is as follows:

$$k = 2\pi . \lambda^{-1} . n_m^{1/2}$$

Figure 11:
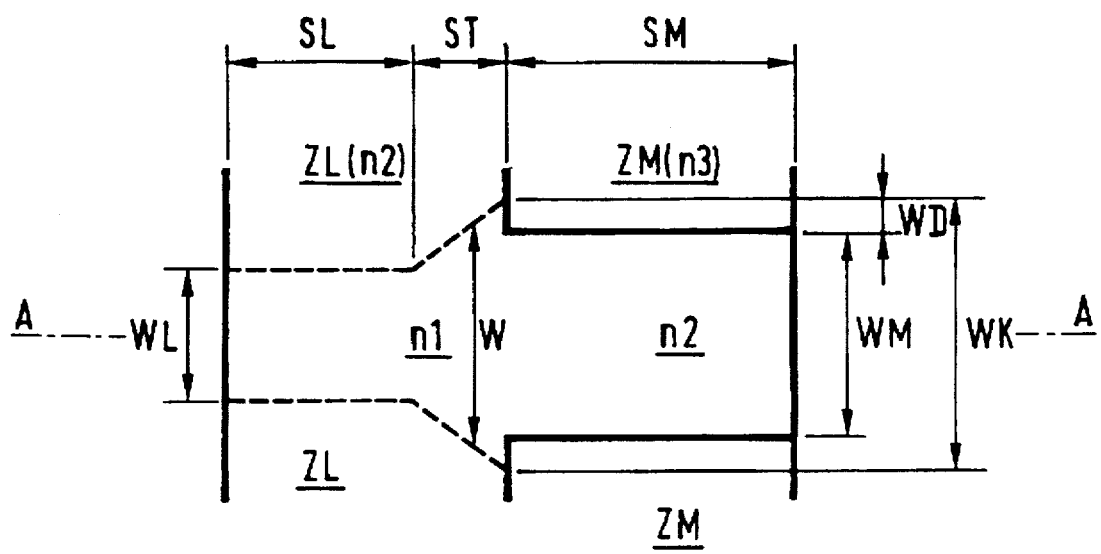
FIG. 11 is a plan view of a composite waveguide of the device.

As shown in FIG. 11, said rear portion typically includes a rear segment SL and a transition segment ST connecting the rear segment to said front segment SM, a forward direction DX being defined from the rear segment towards the front segment, the width W of the waveguide having a first value WL in the rear segment and a second value WM, that is greater than the first value, in the front segment. In which case, and according to the present invention, the width increases progressively in the transition segment in the forward direction from the first value to a maximum value WK that is reached in the vicinity of the connection zone and that is greater than said second value. Preferably, the waveguide is symmetrical about a longitudinal plane A at least in the vicinity of the connection zone.

More particularly, and as in the above-described device, the waveguide is formed at each point along its length by a set of superposed layers such as CB, GL, and CS in the rear portion and CB, GM, CS, 6, and 10 in the front segment, which layers have respective thicknesses. At least one of the superposed layers includes a ridge such as GL in the rear segment and RM in the front segment. The ridge extends along the length of the waveguide over the thickness of the layer and has a limited width. Said ridge has a refractive index constituting a ridge index, and it is surrounded laterally by lateral confinement zones such as 4 in the rear segment and 14 and 16 in the front segment. These zones have refractive indices constituting confinement indices. The confinement indices are lower than the ridge index. The width of the waveguide is an effective ridge width defined in a set that comprises at least one layer and that is constituted by the layer(s) including said ridge(s). The waveguide has a confinement configuration in each cross-sectional plane including a point along its length. The configuration is that of the layers, ridges, and confinement zones with their thicknesses and refractive indices, with the exception of the width of the waveguide. The confinement configuration is uniform both in the rear portion of the waveguide, and also in its front segment, the lateral confinement factor being greater in the rear segment than in the front segment. Typically, the rear portion is connected directly to the front segment.

In the device given by way of example above, the optical waveguide is monomode for guided light having a wavelength of 1,550 nm. The rear segment SL has a homogeneous core that is constituted by the layer GL and that has a refractive index $n_1$. The core is surrounded by an optically homogeneous set of confinement materials having a refractive index $n_2$. The core has a width WL and a thickness HL. These dimensions and its index difference $\Delta nL = n_1 - n_2$ give it a confinement factor VL.

In the front segment SM, the width of the waveguide is the width WM of the external ridge RM. A vertical confinement factor is essentially defined by the thickness HL of the layer GM and by an index difference between that layer and the adjacent layers. The lateral confinement factor VM essentially depends firstly on the index difference:

$$\Delta nM = n_2 - n_3$$

and secondly on the thickness HM of the ridge. It is less than VL.

In the transition segment ST, the confinement factor in the transverse direction DX essentially depends on the thickness HL and on the index difference $\Delta nL$. The width of the ridge GL in the transition segment constitutes the width of the waveguide therein. Said width increases, e.g. linearly, in the forward direction from WL to a maximum width WK that is greater than WM.

The light loss as the light goes from segment SL to segment SM decreases with increasing length L of the transition segment ST. However, the length of the transition segment must be limited in order to avoid making the manufactured device too big. For a semiconductor modulator laser assembly such as the assembly given by way of example, it would seem that the length of the transition segment should lie in the range 100 µm to 500 µm.

Figure 12:
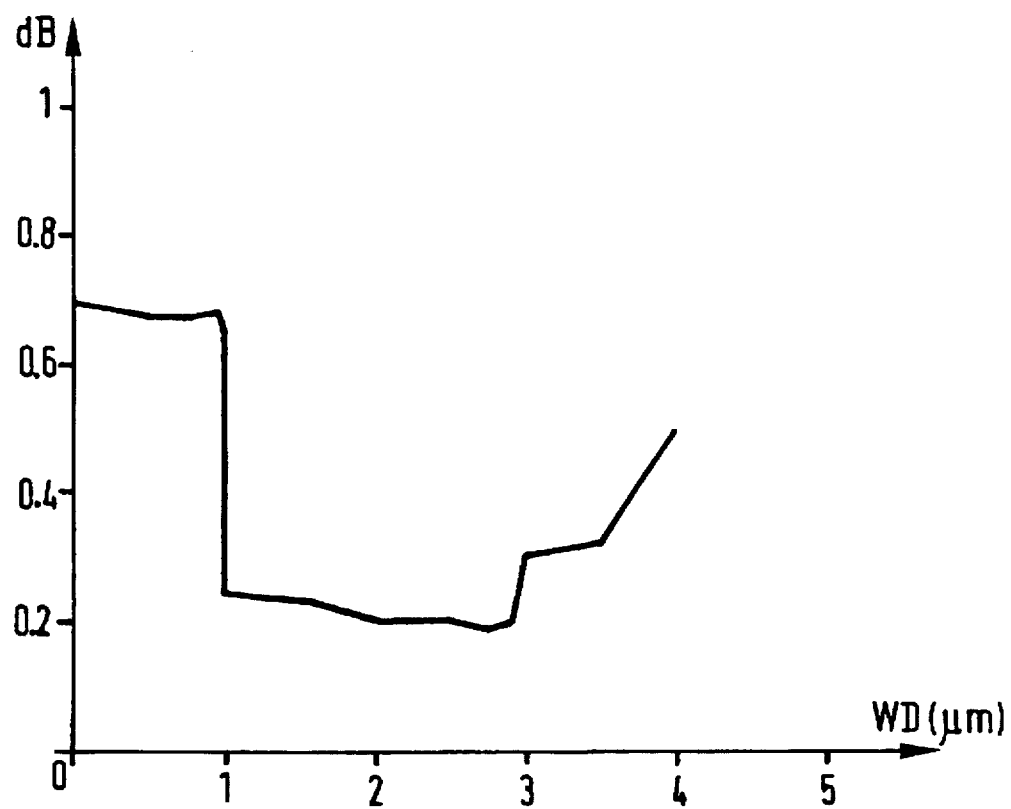
FIG. 12 is a graph showing how light loss in the device varies as a function of excess width of a waveguide segment of the device.

The light loss also varies as a function of excess end width 2WD=WK−WM of the transition segment relative to the front segment. This variation is shown in FIG. 12, with the loss values being plotted up the y-axis in decibels, and the excess width WD being plotted along the x-axis in micrometers. The loss values were supplied by a data-processing model with the other parameters having the following values:

| WL = 2 µm    | $\Delta nL$ = 0.04  | HL = 0.2 µm |
| WM = 4 µm    | $\Delta nM$ = 0.005 | HM = 2 µm   |
| L = 0.2 µm   |                     |             |

As shown in FIG. 12, the half excess width WD should preferably lie in the range 1 µm to 3 µm.

More generally, it would seem preferable for the excess to lie in the range 0.1 µm to 30 µm.

Furthermore, in order to facilitate implementing the device, it may be acceptable or preferable for the point in the connection zone where the transition segment is connected to the front segment, at which point the width changes where the reduction in the width of the waveguide is located, to be offset slightly forwards or backwards relative to a point at which the confinement changes where the reduction in the confinement factor is located. The reduction in the width of the waveguide may also be progressive.

As in the above-described example, the waveguide of the invention may be typically included in a device for processing light guided in the waveguide. The light to be processed may propagate longitudinally either in said forward direction or in the opposite direction. As in said example, the processing may consist in generating said light and in modulating it. More generally, such processing includes two successive operations concerning the light, one of which operations being performed in the rear segment, and the other operation being performed in the front segment, the difference between the confinement configurations of the two segments being made necessary by the respective natures of the two operations.

We claim:

1. An optical waveguide, the waveguide including, in monolithic manner, a rear portion and a front segment extending and succeeding each other along the length of the waveguide and being connected together in a connection zone, the waveguide having a width and a lateral confinement factor at each point along its length, said factor being constituted by the ratio of optical power confined in the width divided by total optical power, the optical powers being those of the same light guided by the waveguide, said factor being greater in the rear portion than in the front segment in the vicinity of the connection zone, wherein the width is also greater in the rear portion than in the front segment in the vicinity of the connection zone.

2. A waveguide according to claim 1, said rear portion including a rear segment and a transition segment connecting the rear segment to said front segment, a forward direction being defined from the rear segment towards the front segment, the width of the waveguide having a first value in the rear segment and a second value, that is greater than the first value, in the front segment, the width increasing progressively in the transition segment in the forward direction from the first value to a maximum value that is reached in the vicinity of the connection zone and that is greater than said second value.

3. A waveguide according to claim 2, the waveguide being symmetrical about a longitudinal axis at least in the vicinity of the connection zone.

4. A waveguide according to claim 2, the waveguide being formed at each point along its length by a set of superposed layers having respective thicknesses, at least one of the superposed layers including a ridge extending along the length of the waveguide over the thickness of the layer and having a limited width, said ridge having a refractive index constituting a ridge index, the ridge being surrounded laterally by lateral confinement zones having refractive indices constituting confinement indices that are lower than the ridge index, the width of the waveguide being an effective ridge width defined in a set that comprises at least one layer and that is constituted by the layer(s) including said ridge(s), the waveguide having a confinement configuration at said point along its length, the configuration being that of the layers, ridges, and confinement zones with their thicknesses and refractive indices, with the exception of the width of the waveguide, in a cross-sectional plane including that point, the confinement configuration being uniform both in the rear portion of the waveguide, and also in its front segment, the lateral confinement factor being greater in the rear segment than in the front segment.

5. A waveguide according to claim 4, the rear portion being connected directly to the front segment.

6. A waveguide according to claim 5, the waveguide being formed in a semiconductor substrate, a buried ridge and an external ridge respectively constituting the rear segment and the front segment of the waveguide.

7. A waveguide according to claim 6, said rear segment and said front segment respectively constituting a laser emitter for generating light and an optical modulator for modulating said light.

8. A waveguide according to claim 2, the waveguide being included in a device for processing light guided in the waveguide.

* * * * *